(12) United States Patent
Hung et al.

(10) Patent No.: US 6,190,999 B1
(45) Date of Patent: Feb. 20, 2001

(54) METHOD FOR FABRICATING A SHALLOW TRENCH ISOLATION STRUCTURE

(75) Inventors: Tsung-Yuan Hung, Tainan; William Lu, Tai-Ping, both of (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/152,360

(22) Filed: Sep. 14, 1998

(30) Foreign Application Priority Data

Jun. 22, 1998 (TW) ................................................ 87109988

(51) Int. Cl.[7] ...................................................... H01L 21/76
(52) U.S. Cl. ........................ 438/424; 438/221; 438/296; 438/692
(58) Field of Search .................................. 438/424, 439, 438/692, 221, 427, 443, 296

(56) References Cited

U.S. PATENT DOCUMENTS

| | | | | |
|---|---|---|---|---|
| 5,316,965 | * | 5/1994 | Philipossian et al. | 438/424 |
| 5,733,383 | * | 3/1998 | Fazan et al. | 438/424 |
| 5,817,568 | * | 10/1998 | Chao | 438/427 |
| 5,963,819 | * | 10/1999 | Lan | 438/424 |
| 5,966,614 | * | 12/1999 | Park et al. | 438/424 |
| 5,970,362 | * | 10/1999 | Lyons et al. | 438/424 |
| 5,976,948 | * | 11/1999 | Werner | 438/424 |
| 6,004,863 | * | 12/1999 | Jang | 438/424 |
| 6,004,864 | * | 12/1999 | Huang et al. | 438/424 |
| 6,017,803 | * | 1/2000 | Wong | 438/424 |
| 6,057,208 | * | 5/2000 | Lin et al. | 438/424 |
| 6,064,105 | * | 5/2000 | Li et al. | 438/692 |
| 6,090,683 | * | 6/2000 | Torek | 438/692 |

\* cited by examiner

*Primary Examiner*—Charles Bowers
*Assistant Examiner*—David S Blum
(74) *Attorney, Agent, or Firm*—Thomas, Kayden, Horstemeyer & Risley

(57) ABSTRACT

A method for fabricating a shallow trench isolation (STI) structure includes a pad oxide layer and a hard masking layer are sequentially formed over a semiconductor substrate. A trench is formed in the substrate by patterning over the substrate. Then, the hard masking layer is removed to expose the pad oxide layer. An insulating layer is formed over the substrate to fill the trench. Using the pad oxide layer as a polishing stop, a CMP process is performed to polish the insulating layer until the pad oxide layer is exposed. The remained pad oxide within the trench is simultaneously planarized to have a planar top surface without dishing and microscratch. After the pad oxide is removed, the STI structure is accomplished.

10 Claims, 3 Drawing Sheets

METHOD FOR FABRICATING A SHALLOW TRENCH ISOLATION STRUCTURE

CROSS-REFERENCE TO RELATED APPLICATION

This application claims the priority benefit of Taiwan application serial no. 87109988, filed Jun. 22, 1998, the full disclosure of which is incorporated herein by reference.

BACKGROUND OF THE INVENTION

1. Field of the Invention

This invention relates to semiconductor fabrication, and more particularly to a method for fabricating a STI structure to prevent microscratch from occurring on the STI structure during a chemical mechanical polishing (CMP) process.

2. Description of Related Art

The purpose of an isolation structure in an IC device is to prevent carriers, such as electrons or electron-holes, from drifting between two adjacent device elements through a semiconductor substrate to cause a current leakage. For example, carriers drift between two adjacent transistor through their substrate. Conventionally, isolation structures are formed between field effect transistors (FETs) in an IC device, such as a dynamic random access memory (DRAM) device, to prevent a current leakage from occurring. A shallow trench isolation (STI) structure is one of the isolation structures being widely used.

FIGS. 1A–1D are cross-sectional views of a semiconductor device schematically illustrating a conventional fabrication process for forming a shallow trench isolation structure. In FIG. 1A, a pad oxide layer 102 and a silicon nitride layer 104 are sequentially formed over a semiconductor substrate 100. In FIG. 1B, a trench 106 is formed in the substrate 100 by patterning over the substrate 100 through, for example, photolithography and etching. The silicon nitride layer 104 and the pad oxide layer 102 are etched through and become a silicon nitride layer 104a and a pad oxide layer 102a. Then, a liner oxide layer 108 is formed over the side-wall of the trench 106.

In FIG. 1C and FIG. 1D, an oxide layer 110 is formed over the substrate 100 so that the trench 106 shown in FIG. 1B is filled with oxide. A CMP process is, for example, performed to polish the oxide layer 110, in which the silicon nitride layer 104a is used as a polishing step so that it is exposed. Then, the silicon nitride layer 104a is removed by, for example, wet etching. A residual of the oxide layer 110 fills the trench 106 becoming a STI oxide 110a.

The CMP process is one of planarization technologies by making use of slurry, which is a chemical reagent, to chemically and mechanically polish the uneven surface of a deposited oxide layer so as to achieve a planarization purpose. Slurry contains a huge number of fine grinding particles with a dimension of about 0.1–0.2 microns. The grinding particles compose a good abrasive. A rotating holder holds the wafer on the backside. The front surface is pushed onto a polishing pad, which is held by a rotating polishing table. Slurry is provided on the contact surface between the polishing pad and the front surface of the wafer. Since they are rotated, the polishing purpose is achieved. The ingredient of slurry is different for a different material to be polished.

During the CMP process, the fine grinding particles may cause a microscratch on a soft material. For example, in a method for fabricating a STI structure as described above, the oxide layer 110 is usually formed by atmospheric pressure (AP) chemical vapor deposition (CVD) (APCVD). In FIG. 1C, the oxide layer 110 is thereby soft. As the CMP process is performed to form the STI oxide 110a, in order to totally remove the oxide layer 110 above the silicon nitride layer 104a, the silicon nitride layer 104a is strategically over-polished. Since the hardness of silicon nitride is higher than oxide, oxide is polished away with a higher rate to cause a dishing top surface of the STI oxide 110a. The dishing phenomenon affects the performance of the device.

Moreover, during the over-polishing stage, the CMP process polishes silicon nitride to produce silicon nitride particles, which are mixed with slurry and cause a damage on the STI oxide 110a, such as a microscratch 112. Even though the microscratch phenomenon is not observable by eye, if it is not fixed, it may cause an occurrence of a bridge between polysilicon gates formed subsequently or an occurrence of pattern distortion, in which the bridge may induce current leakage. The microscratch phenomenon then results in a failure of device. The yield rate is decreased.

Furthermore, since the silicon nitride layer 104a is not removed before forming the oxide layer 110, the total depth of the trench 106 counting from the silicon nitride layer 104a is large. This deteriorates the filling performance of the oxide layer 110 into the trench 106.

SUMMARY OF THE INVENTION

It is therefore an objective of the present invention to provide a method for fabricating a STI structure with a prevention of microscratch resulting from performing a CMP process on it.

It is another an objective of the present invention to provide a method for fabricating a STI structure, which has smaller trench depth so as to increase the filling performance into the trench.

It is still another an objective of the present invention to provide a method for fabricating a STI structure that avoids a dishing phenomenon often due to an over-polishing process.

In accordance with the foregoing and other objectives of the present invention, a method is provided for fabricating a STI structure having a pad oxide layer and a hard masking layer that are sequentially formed over a semiconductor substrate. In accordance with the method, a trench is formed in the substrate by patterning over the substrate. Then, the hard masking layer is removed to expose the pad oxide layer. An insulating layer is formed over the substrate to fill the trench. Using the pad oxide layer as a polishing stop, a CMP process is performed to polish the insulating layer until the pad oxide layer is exposed. The remained pad oxide within the trench is simultaneously planarized to have the same height as the height of the pad oxide layer. After the pad oxide is removed, the STI structure is accomplished.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

In order to prevent the microscratch and dishing phenomena from occurring on a STI structure during a CMP process, an improved method for fabricating a STI structure is provided. The method mainly includes a step of removing a hard masking layer before an oxide layer is formed to fill the trench. Then the oxide layer is formed and is planarize by, for example, a CMP process. Since there is no hard masking layer involved, the microscratch and dishing phenomena are avoided, and the trench depth is reduced so as to have a better filling performance on the trench.

Figure 1A:
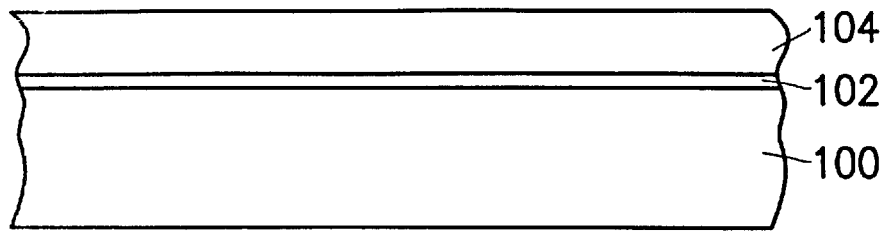
FIGS. 1A–1D are cross-sectional views of a semiconductor device schematically illustrating a conventional fabrication process for forming a shallow trench isolation structure.
Figure 1B:
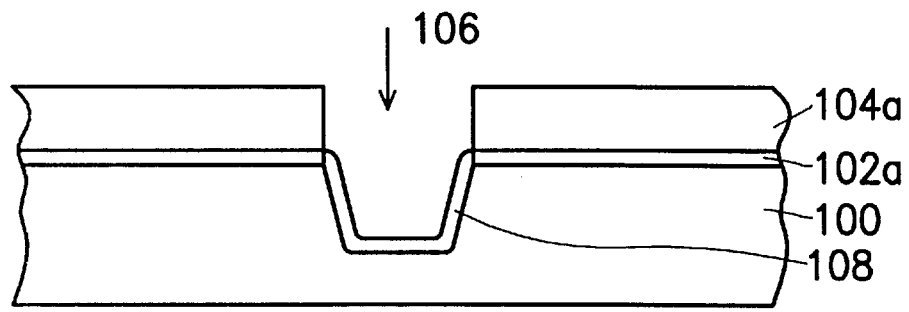
Figure 1C:
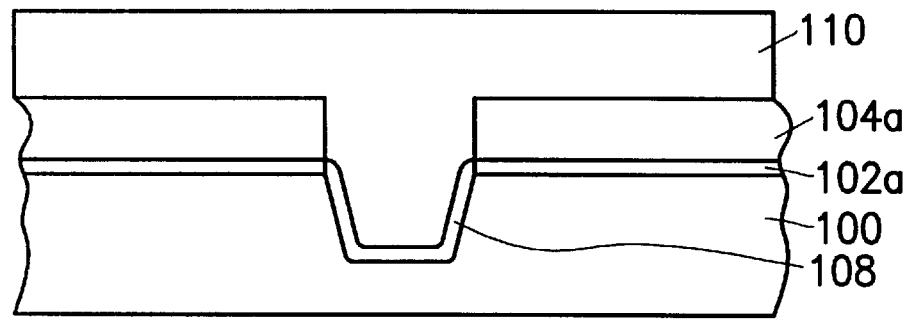
Figure 1D:
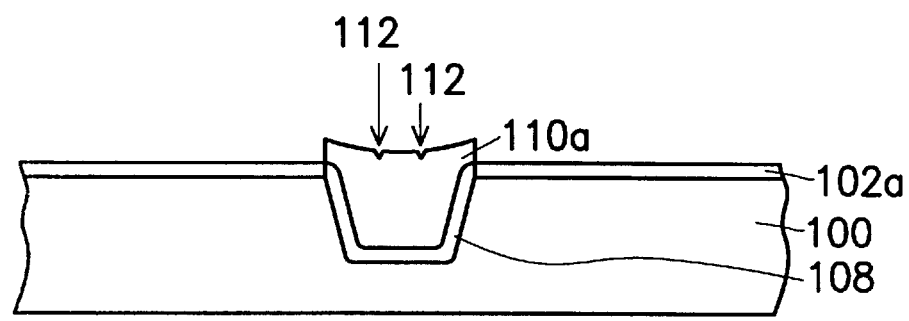
Figure 2A:
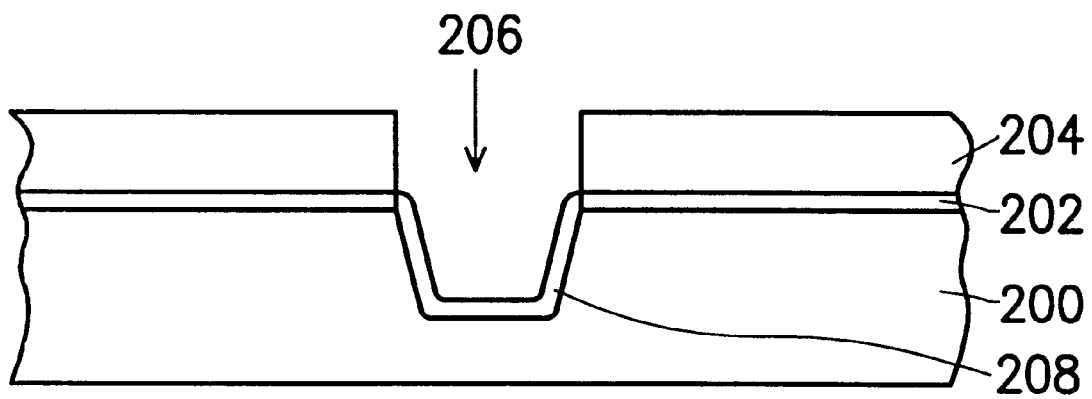
FIGS. 2A–2E are cross-sectional views of a semiconductor device schematically illustrating a fabrication process for forming a shallow trench isolation structure, according to a preferred embodiment of the invention.

FIGS. 2A–2E are cross-sectional views of a semiconductor device schematically illustrating a fabrication process for forming a shallow trench isolation structure, according to a preferred embodiment of the invention. In FIG. 2A, a pad oxide layer 202 and a hard masking layer 204 are sequentially formed over a semiconductor substrate 200. A trench 206 is formed in the substrate 200 by, for example, photolithography and etching, in which the hard masking layer 204 and the pad oxide layer are etched through. After etching, the hard masking layer 204 covers a region over the substrate, where is called active area. The hard masking layer 204 includes, for example, silicon nitride. Next, a liner oxide layer 208 is formed over the side-wall of the trench 206 in the substrate 200 through a thermal oxidation process. Here, the liner oxide layer 208 may preferably by included to increase adhesion for the material to be subsequently formed over.

Figure 2B:
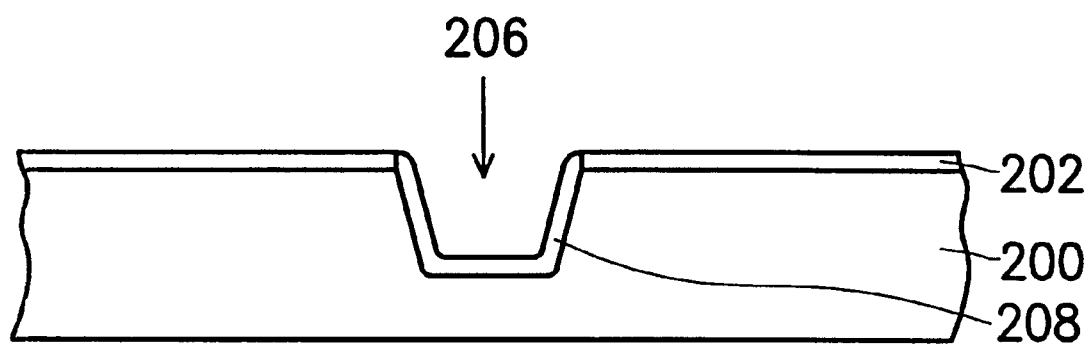
Figure 2C:
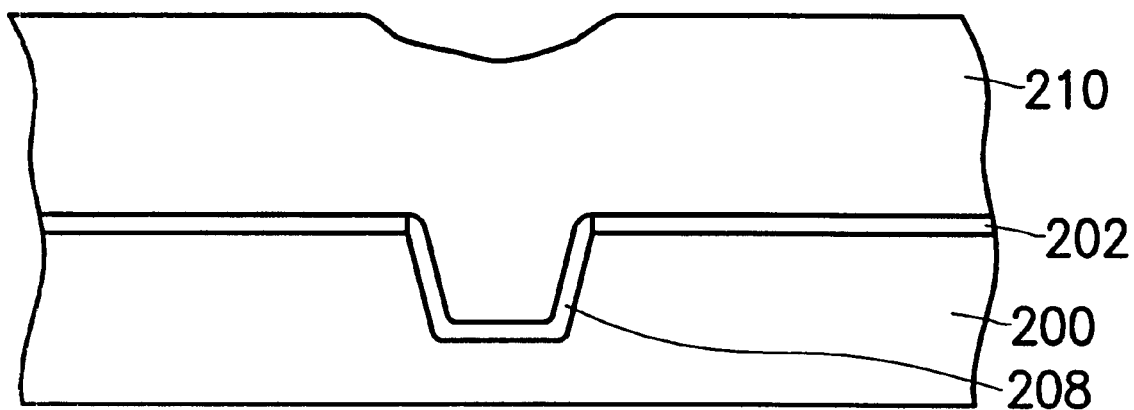

In FIG. 2B, the hard masking layer 204 is removed by, for example, wet etching so that the pad oxide layer 202 is exposed. The purpose of removing the hard masking layer is to reduce the step depth of the trench 206 to have a better subsequent filling performance. In FIG. 2C, an insulating layer 210 layer is formed over the substrate 200 by, for example, APCVD or low pressure CVD (LPCVD) to deposit oxide over the substrate 200.

Figure 2D:
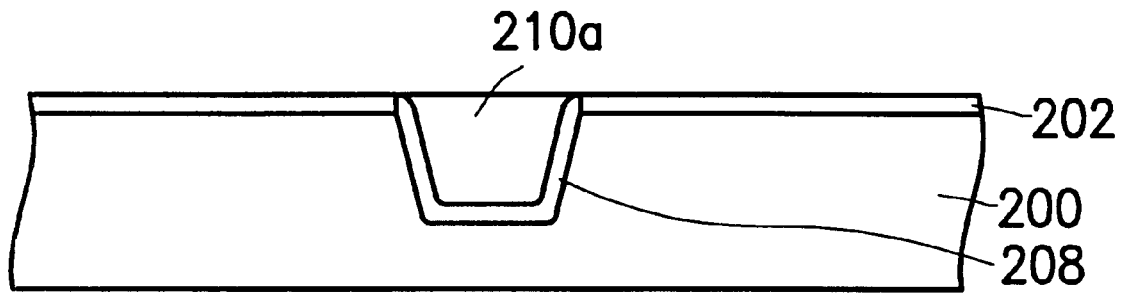

In FIG. 2D, using the pad oxide layer 202 as a polishing stop, a CMP process is performed to planarize over the substrate 200 so that a portion of the insulating layer 210 other than the trench 206 shown in FIG. 2A is polished away to expose the pad oxide layer 202. This can be achieved by controlling the operation time of the CMP process to avoid an overpolishing on the pad oxide layer 202. The remained portion of the insulating layer 210 within the trench 206 becomes a trench oxide 210a. Since there is no masking layer 204 shown in FIG. 2A involved, the trench oxide 210a has a planar surface on the top without dishing during the CMP process and more that microscratch does not occur on the STI oxide 210a.

Figure 2E:
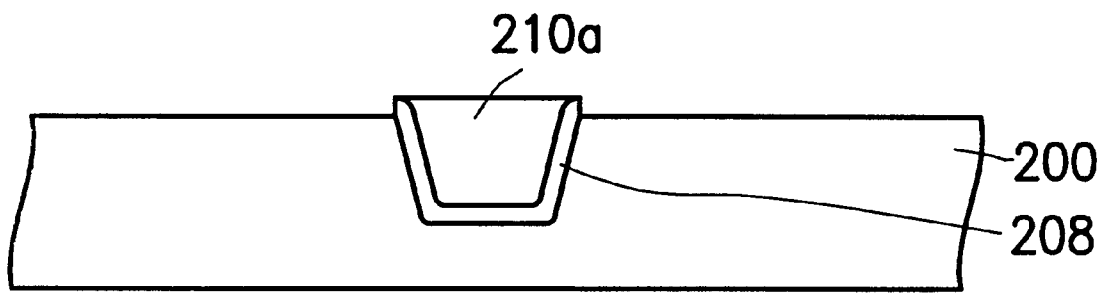

In FIG. 2E, the pad oxide layer 202 is removed by, for example, dipping in a diluted HF acid solution. After removing the pad oxide layer 202, a STI structure including the liner oxide layer 208 and the STI oxide 210a is formed, in which the liner oxide layer 208 is preferably included to have a better adhesion for the material to be subsequently formed over.

In conclusion, the invention is characterized by following:

1. The hard masking layer 204 is removed before forming the insulating layer 210 so as to reduce the step depth for trench filling performance.

2. Since the hard masking layer 204 is removed before forming the insulating layer 210, during the CMP process to polish the insulating layer 210, the microscratch and dishing phenomenon are effectively avoided.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a shallow trench isolation (STI) structure on a semiconductor substrate, having a pad oxide layer and a silicon nitride layer as a masking layer sequentially formed over the substrate, and having a trench formed in the substrate through the pad oxide layer and the masking layer, the method comprising:

removing the masking layer to expose the pad oxide layer;

forming an insulating layer directly on the exposed pad oxide layer to fill the trench;

performing a chemical mechanical polishing (CMP) process, using the pad oxide layer as a polishing step, to planarize the insulating layer until the pad oxide layer is exposed; and removing the pad oxide layer.

2. The method of claim 1, wherein before the step of forming the insulating layer, the method further comprises forming a liner oxide layer over a side-wall of the trench in the substrate.

3. The method of claim 1, wherein the step of performing the CMP process comprises a control of operation of the CMP process so as to avoid an over polishing on the pad oxide layer.

4. The method of claim 1, wherein the step of removing the pad oxide layer comprises a diluted HF acid solution.

5. The method of claim 1, wherein the step of forming the insulating layer comprises atmospheric pressure chemical vapor deposition (APCVD) or low pressure CVD (LPCVD).

6. A method for fabricating a shallow trench isolation (STI) structure on a semiconductor substrate, the method comprising:

sequentially forming a pad oxide layer and a silicon nitride layer as a masking layer over the substrate;

patterning over the substrate to form a trench, which is through the pad oxide layer, the masking layer, and further down into the substrate;

removing the masking layer to expose the pad oxide layer;

forming an insulating layer directly on the exposed pad oxide layer to fill the trench;

performing a chemical mechanical polishing (CMP) process, using the pad oxide layer as a polishing step, to planarize the insulating layer until the pad oxide layer is exposed; and removing the pad oxide layer.

7. The method of claim 6, wherein before the step of forming the insulating layer, the method further comprises forming a liner oxide layer over a side-wall of the trench in the substrate.

8. The method of claim 6, wherein the step of performing the CMP process comprises a control of operation time of the CMP process so as to avoid an over polishing on the pad oxide layer.

9. The method of claim 6, wherein the step of removing the pad oxide layer comprises a diluted HF acid solution.

10. The method of claim 6, wherein the step of forming the insulating layer comprises atmospheric pressure chemical vapor deposition (APCVD) or low pressure CVD (LPCVD).

* * * * *